United States Patent
Miura et al.

(10) Patent No.: US 6,933,810 B2
(45) Date of Patent: Aug. 23, 2005

(54) SURFACE ACOUSTIC WAVE DEVICE WITH LITHIUM TANTALATE ON A SAPPHIRE SUBSTRATE AND FILTER USING THE SAME

(75) Inventors: Michio Miura, Kawasaki (JP); Takashi Matsuda, Kawasaki (JP); Yoshio Satoh, Kawasaki (JP); Masanori Ueda, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 21 days.

(21) Appl. No.: 10/724,577

(22) Filed: Dec. 1, 2003

(65) Prior Publication Data

US 2004/0135650 A1 Jul. 15, 2004

(30) Foreign Application Priority Data

Dec. 2, 2002 (JP) ........................... 2002-349749

(51) Int. Cl.⁷ ............................. H03H 9/25; H03H 9/64; H03H 9/72
(52) U.S. Cl. ...................... 333/193; 333/195; 333/133; 310/313 B
(58) Field of Search ............................... 333/150–155, 333/193–196, 133; 310/313 R, 313 A–313 D (56) References Cited

U.S. PATENT DOCUMENTS

| | | | | | |
|---|---|---|---|---|---|
| 4,006,438 | A | * | 2/1977 | Bennett | 333/196 |
| 6,198,197 | B1 | * | 3/2001 | Yamanouchi et al. | 310/313 R |
| 6,259,186 | B1 | * | 7/2001 | Shibata et al. | 310/313 A |
| 6,445,265 | B1 | * | 9/2002 | Wright | 333/193 |
| 6,767,749 | B2 | * | 7/2004 | Kub et al. | 438/3 |

FOREIGN PATENT DOCUMENTS

| | | | | |
|---|---|---|---|---|
| JP | 51-77154 | * | 11/1982 | |
| JP | 6-56592 | * | 3/1994 | 427/585 |
| JP | 2516817 | | 4/1996 | |
| JP | 9-208399 | | 8/1997 | |
| JP | 11-55070 | | 2/1999 | |
| JP | 2001-285019 | * | 10/2001 | |

OTHER PUBLICATIONS

Y. Shibata et al.; "Piezoelectric LiNbO3 and LiTaO3 Films for SAW Device Applications", 1996 IEEE Ultrasonics Symposium, vol. 1, Nov. 1996, pp. 247–254.*

SAW Properties of SiO2/128* Y–X LiNbO3 Structure Fabricated by Magnetron Sputtering Technique Kazuhiki Yamanouchi, Member IEEE, and Satoshi Hayama, IEEE Transactions on Sonics and Ultrasonics, vol. SU–31, No. 1, Jan. 1984, pp. 51–57.

Temperature Stable SAW Devices Using Directly Bonded LiTaO3/Glass Substrates H. Sato, K. Onishi, T. Shimamura and Y. Tomita, 1998 IEEE Ultrasonics Symposium, vol. 1, Oct. 1998, pp. 335–338.

Theoretical Analysis of SAW Propagation Characteristics under the Strained Medium and Applications for High Temperature Stable High Coupling SAW Substrates K. Yamanouchi, K. Kotani, H. Odagawa, and Y. Cho, 1999 IEEE Ultrasonics Symposium, vol. 1, Jul. 2000, pp. 471–474.

* cited by examiner

Primary Examiner—Barbara Summons
(74) Attorney, Agent, or Firm—Arent Fox PLLC (57) ABSTRACT

A surface acoustic wave device includes a piezoelectric substrate having a first surface on which comb-like electrodes are formed, and a second surface, and a support substrate joined to the second surface of the piezoelectric substrate. The piezoelectric substrate is made of lithium, tantalate, and the support substrate is made of sapphire. The following expressions being satisfied:

$$T/t < 1/3 \qquad (1)$$

$$T/\lambda > 10 \qquad (2)$$

where T is a thickness of the piezoelectric substrate, t is a thickness of the support substrate, and λ is a wavelength of a surface acoustic filter, propagated along the first surface of the piezoelectric substrate.

4 Claims, 11 Drawing Sheets

SURFACE ACOUSTIC WAVE DEVICE WITH LITHIUM TANTALATE ON A SAPPHIRE SUBSTRATE AND FILTER USING THE SAME

BACKGROUND OF THE INVENTION

1. Field of the Invention

The present invention generally relates to surface acoustic wave devices and filters equipped with the same such as a transmit filter, a receive filter and a duplexer.

2. Description of the Related Art

The SAW device is widely applied to the band-pass filter and duplexer of the cellular phone. In recent years, the filter using the SAW device is required to have higher performance as the cellular phone has higher performance. One of the requirements for the SAW device is to improve the temperature stability because temperature change moves the pass-band frequency range of the filter. As is known, lithium tantalate ($LiTaO_3$, hereinafter simply referred to as LT) is a piezoelectric material having a large electromechanical coupling coefficient, which is advantageous for realizing broad filter characteristics. However, LT has a disadvantage in that it is inferior to quartz crystal in terms of temperature stability. The piezoelectric material has a general tendency of incompatible characteristics such that materials having large electromechanical coupling coefficients such as LT and lithium niobate ($LiNbO_3$, hereinafter simply referred to as LN) have comparatively poor temperature stability, while materials having good temperature stability such as quartz crystal have comparatively small electromechanical coupling coefficients. Thus, a piezoelectric material having both a large electromechanical coupling coefficient and a good temperature stability has been sought for years.

There are various proposals to realize materials having a large electromechanical coupling coefficient and a good temperature stability. For example, Yamanouchi et al. propose a substrate having an LN or LT substrate and an $SiO_2$ film, which is grown thereon and has a temperature coefficient opposite to that of LN or LT (see IEEE Trans. On Sonics and Ultrasonics., vol. SU-31, pp. 51–57, 1984). Nakamura et al. achieve improvements in temperature stability by forming a polarization inverted region in the LT substrate surface that has a depth less than the involved wavelength and by utilizing the electrostatic short-circuit effect thereof (see Japanese Patent No. 2516817). Onishi et al. propose to improve the temperature stability by directly joining a thin piezoelectric substrate and another substrate made of a thick, low-expansion material and thus restraining contraction and expansion due to change of the temperature of the piezoelectric substrate (see Japanese Laid-Open Patent Application No. 11-55070, or H. Sato et al., Proc. Of IEEE Ultrasonics Symposium, pp. 335–338, 1998). Yamanouchi et al. propose to use adhesive for joining the two substrates (see, Yamanouchi et al., "Proc. of IEEE Ultrasonics Symposium", pp. 239–242, November, 1999). Japanese Laid-Open Patent Application No. 9-208399 proposes to improve the filter performance by joining two different kinds of substrates in solid-phase reaction.

However, the above-mentioned proposals have problems to be solved. The proposal by Yamanouchi et al. has difficulty in controlling the thickness and quality of the $SiO_2$ film, this resulting in frequency deviations of the SAW devices. Further, the proposal requires providing the silicon oxide film on the comb-type electrodes (interdigital transducers: IDT), this increasing the SAW propagation loss. It follows that the proposal may be applied to only limited SAW devices.

The proposal described in Japanese Patent No. 2516817 has a problem that the polarization inverted layer affects the performance of the SAW device and very fine depth control of the polarization inverted layer is required.

There are problems in the proposals described in Japanese Laid-Open Patent Application No. 11-55070 and taught by Onishi et al. The way of joining the low-expansion substrate to the piezoelectric substrate requires high-temperature annealing that follows the step of washing the substrates. It is therefore required to use, as the low-expansion substrate, a substrate having a small Young's modulus such as glass in order to prevent the wafer from being broken during the annealing process. Thus, distortion due to the difference in thermal expansion coefficient between the substrates thus joined is not transferred to the main substrate sufficiently, so that improvement in the temperature stability cannot be exhibited well.

The method of joining the piezoelectric substrate to the low-expansion substrate at room temperature by means of UV cure adhesive reduces stress by the adhesive at the joint interface. However, this reduces the degree of improvement in temperature stability.

The way of joining the substrates in the solid-phase reaction described in Japanese Laid-Open Patent Application No. 9-208399 requires the thermal treatment at 1000° C. or higher at which melting does not take place after the step of joining. This may change some constants of the piezoelectric substrate and thus causes velocity change, so that frequency deviations occur.

SUMMARY OF THE INVENTION

It is a general object of the present invention to provide a surface acoustic wave device in which the above disadvantages are eliminated.

A more specific object of the present invention is to provide a surface acoustic wave device that has reduced frequency differences among the devices, reduced propagation loss, improved frequency-temperature characteristics, and improved productivity.

A further object of the present invention is to provide a filter equipped with such a surface acoustic wave device.

The above objects of the present invention are achieved by a surface acoustic wave device comprising: a piezoelectric substrate having a first surface on which comb-like electrodes are formed, and a second surface; and a support substrate joined to the second surface of the piezoelectric substrate, the piezoelectric substrate being made of lithium tantalate, and the support substrate being made of sapphire, the following expressions being satisfied:

$$T/t < \frac{1}{3} \tag{1}$$

$$T/\lambda > 10 \tag{2}$$

where T is a thickness of the piezoelectric substrate, t is a thickness of the support substrate, and λ is a wavelength of a surface acoustic filter propagated along the first surface of the piezoelectric substrate.

The above objects of the present invention is achieved by a filter comprising: a piezoelectric substrate having a first surface on which comb-like electrodes are arranged so as to form a transmit filter and a receive filter, and a second surface; and a support substrate joined to the second surface of the piezoelectric substrate, the piezoelectric substrate being made of lithium, tantalate, and the support substrate being made of sapphire, the following expressions being satisfied:

$$T/t < \frac{1}{3} \tag{1}$$

$$T/\lambda > 10 \tag{2}$$

where T is a thickness of the piezoelectric substrate, t is a thickness of the support substrate, and λ is a wavelength of a surface acoustic filter propagated along the first surface of the piezoelectric substrate.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

A description will now be given of embodiments of the present invention with reference to the accompanying drawings.

Figure 1:
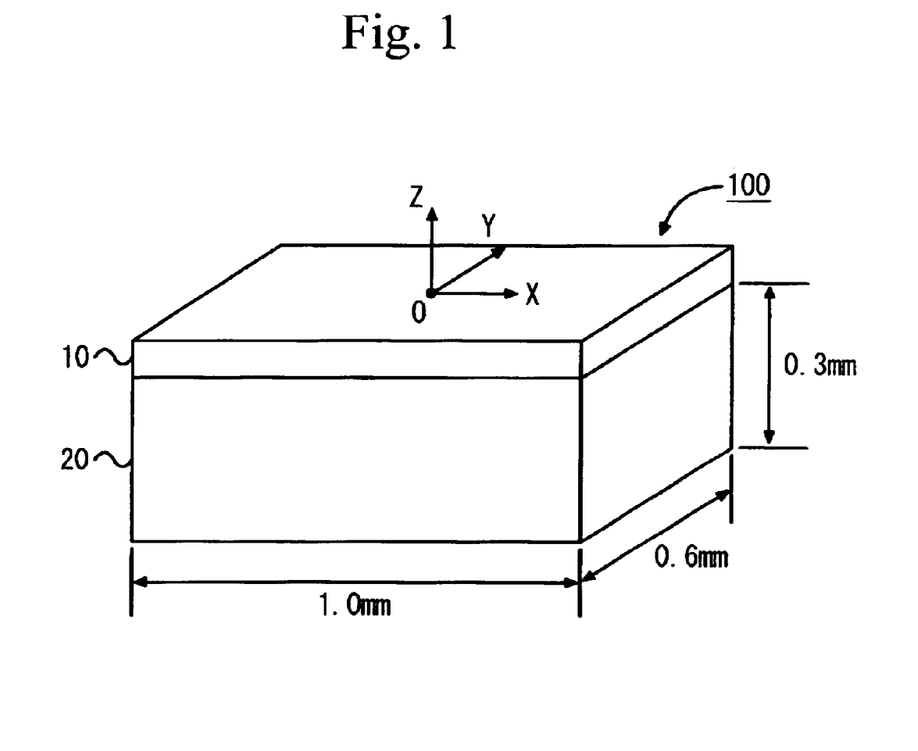
FIG. 1 is a perspective view of a model of a joint substrate used to explain an embodiment of the present invention.
Figure 2:
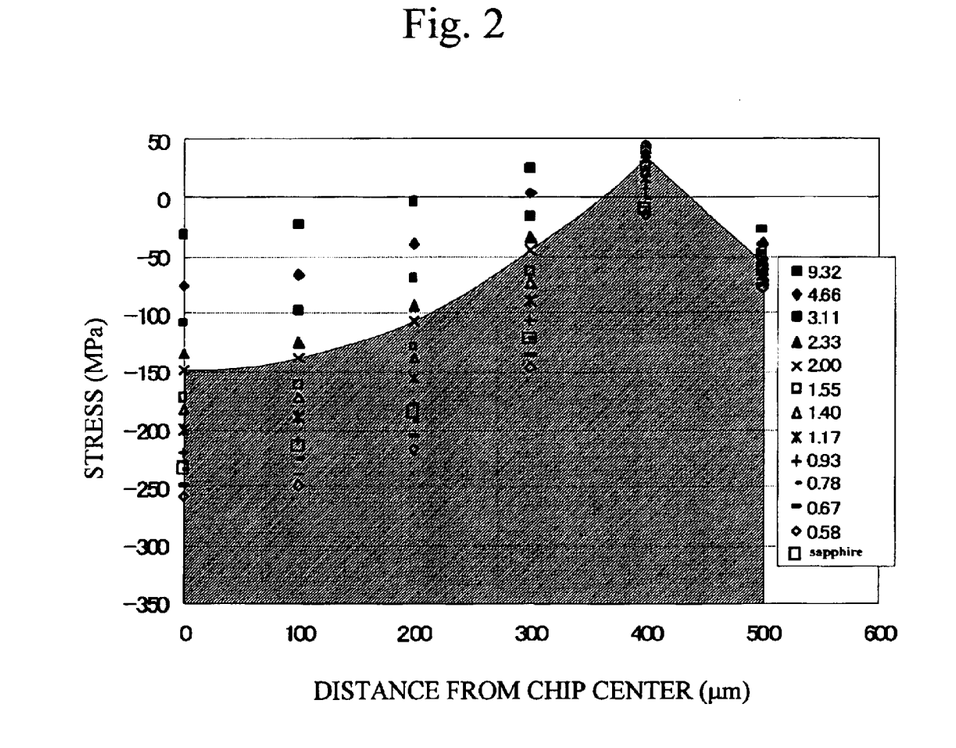
FIG. 2 is a graph showing the results of analysis simulation using the finite element method for the joint substrate equipped with a piezoelectric substrate having a thickness (T) of 100 μm.
Figure 3:
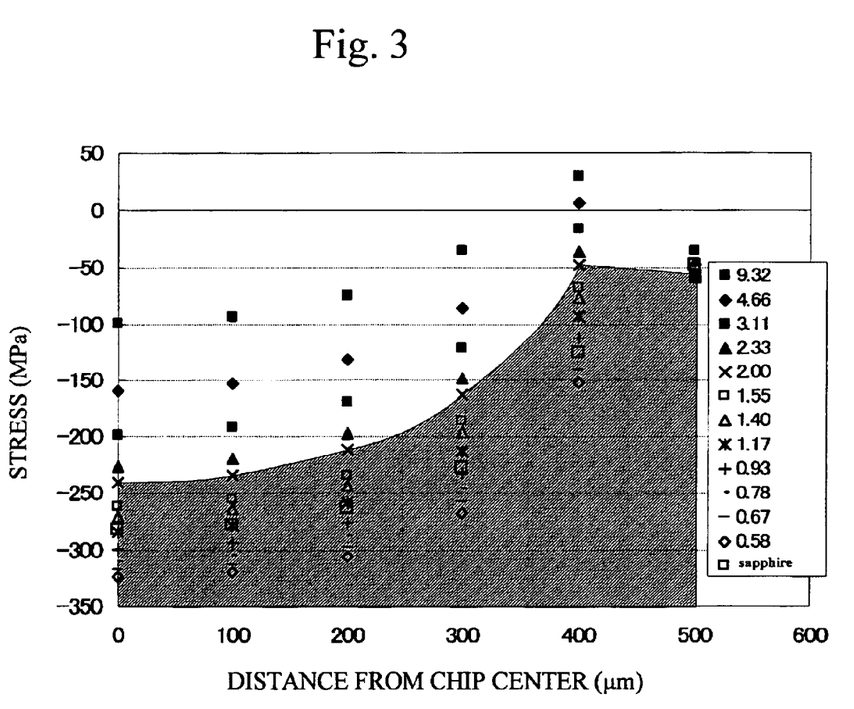
FIG. 3 is a graph showing the results of analysis simulation using the finite element method for the joint substrate equipped with a piezoelectric substrate having a thickness (T) of 50 μm.
Figure 4:
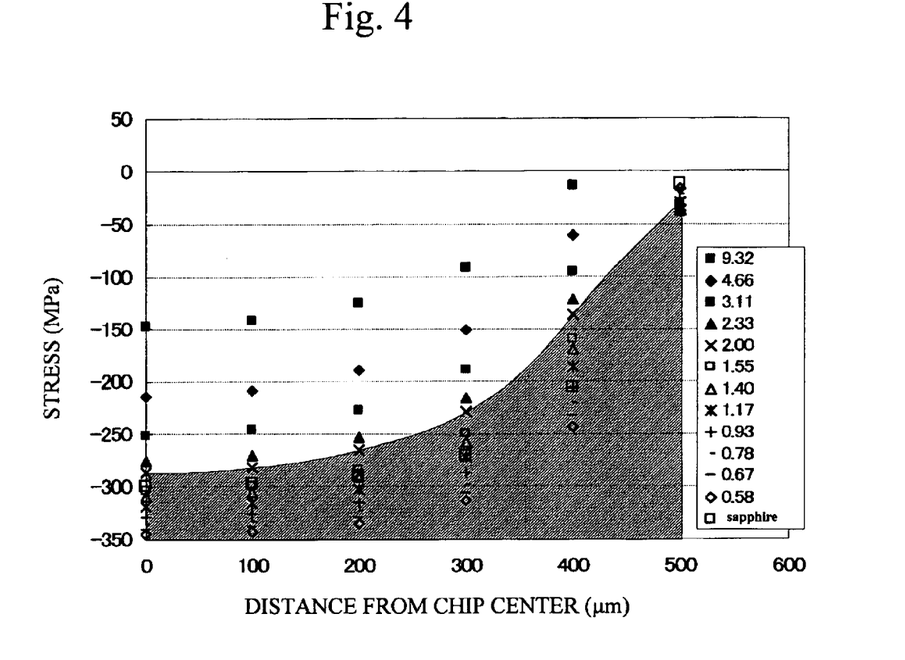
FIG. 4 is a graph showing the results of analysis simulation using the finite element method for the joint substrate equipped with a piezoelectric substrate having a thickness (T) of 30 μm.

FIG. 1 is a perspective view of a model of a joint substrate 100 used in a first embodiment of the present invention. FIGS. 2 through 4 are respectively graphs that show the results of analysis simulations for the joint substrate 100 by the finite element method.

Referring to FIG. 1, the model of the joint substrate 100 has a support substrate 20 and a main substrate or a piezoelectric substrate 10. The support substrate 20 is 1.0 mm long in the SAW propagation direction (X direction), 0.6 mm long in the direction (Y direction) perpendicular to the SAW propagation direction, and 0.3 mm thick in the thickness direction (Z direction). The piezoelectric substrate 20 that has a given thickness is joined to the main surface of the support substrate 20. The piezoelectric substrate 20 has a first surface on which a SAW resonator 30 (see FIG. 9) is formed, and a second surface that is opposite to the first surface and is joined to the support substrate 20. The analysis simulation using the finite element method utilizes the symmetry of the structure of the model, and computes thermal stress at points measured from the origin (X, Y, Z) that is the center of the first surface of the piezoelectric substrate 10. That is, the origin has coordinates (0, 0, 0).

The piezoelectric substrate 10 in the model was made of lithium tantalate (LT), which has a thermal expansion coefficient of 16.1 ppm/° C. and a Young's modulus (E) of 233 GPa. The support substrate 20 in the model was made of sapphire. In addition, materials other than sapphire were used which have a linear expansion coefficient of 3.35 ppm/° C. and a Young's modulus (e) falling within the range of 25 GPa to 400 GPa. That is, two cases were simulated. In the first case, the ratio of the Young's modulus E of the piezoelectric substrate 10 to the Young's modulus e of the support substrate 20 (E/e) was changed from 0.58 to 9.82. The second case used the combination of lithium tantalate and sapphire for the joint substrate 100.

Further, in the simulation, the thickness (T) of the piezoelectric substrate 10 was stepwise changed to 30 μm, 50 μm and 100 μm. That is, the ratio of the thickness (T) of the piezoelectric substrate 10 to the thickness (t) of the support substrate 20 was stepwise changed to 0.10, 0.17 and 0.33. In the simulation, thermal stress and the amount of deformation that occur when the temperature is raised by 100° C. from the junction temperature involved in the piezoelectric substrate 10 and the support substrate 20 (in the absence of stress and deformation).

FIG. 2 is a graph that shows thermal stress obtained by simulation of analyzing the joint substrate 100 with the thickness (T) of the piezoelectric substrate 10 equal to 100 μm. FIG. 3 is a graph that shows thermal stress obtained by simulation of analyzing the joint substrate 100 with the thickness (T) of the piezoelectric substrate 10 equal to 50 μm. FIG. 4 is a graph that shows thermal stress obtained by simulation of analyzing the joint substrate 100 with the thickness (T) of the piezoelectric substrate 10 equal to 30 μm. In the negative (minus sign) regions along the vertical axes (stress (MPa)) of the graphs, the support substrate 20 functions to restrain expansion of the piezoelectric substrate 10 due to temperature rise. In other words, stress occurs in the direction (toward the origin) in which expansion of the piezoelectric substrate 10 is restrained in the negative regions.

As shown in FIG. 2, for T/t equal to 0.33, most of the joint substrates 100 other than the joint substrate with the support substrate 20 of sapphire show that thermal stress that occurs at positions close to X=400 μm, namely, at positions that are approximately 100 μm inside from the ends of the joint substrates 100 is approximately equal to zero or positive values. This means that expansion of the piezoelectric substrate 10 at positions in the vicinity of X=400 μm is not restrained (thermal stress is zero) or is facilitated (thermal stress has a positive value). In order to improve the temperature coefficient of frequency of the SAW device by using the joint substrate 100 with positive thermal stress, the SAW resonator 30 (FIG. 9) should be formed in a region in which thermal stress is negative, or a region that is further in than the positions that are 100 μm inside from the chip ends. However, this arrangement prevents downsizing of the SAW device.

Further, as shown in FIGS. 3 and 4, even when the ratio T/t is set to comparatively small values, if the Young' modulus is small, that is, the ratio E/e is large, thermal stress that occurs from the chip ends (X=500 μm) is small at positions of X=400 μm (100 μm inside from the chip ends).

It can be seen from the above that thermal stress that functions to facilitate the thermal expansion of the piezoelectric substrate 10 as the support substrate 20 has a smaller Young's modulus (e) and a reduced thickness (t), in other words, as the ratio E/e becomes larger and the ratio T/t becomes larger. This phenomenon is distinctly exhibited when the ratio E/e is equal to or larger than 2.

Figure 5:
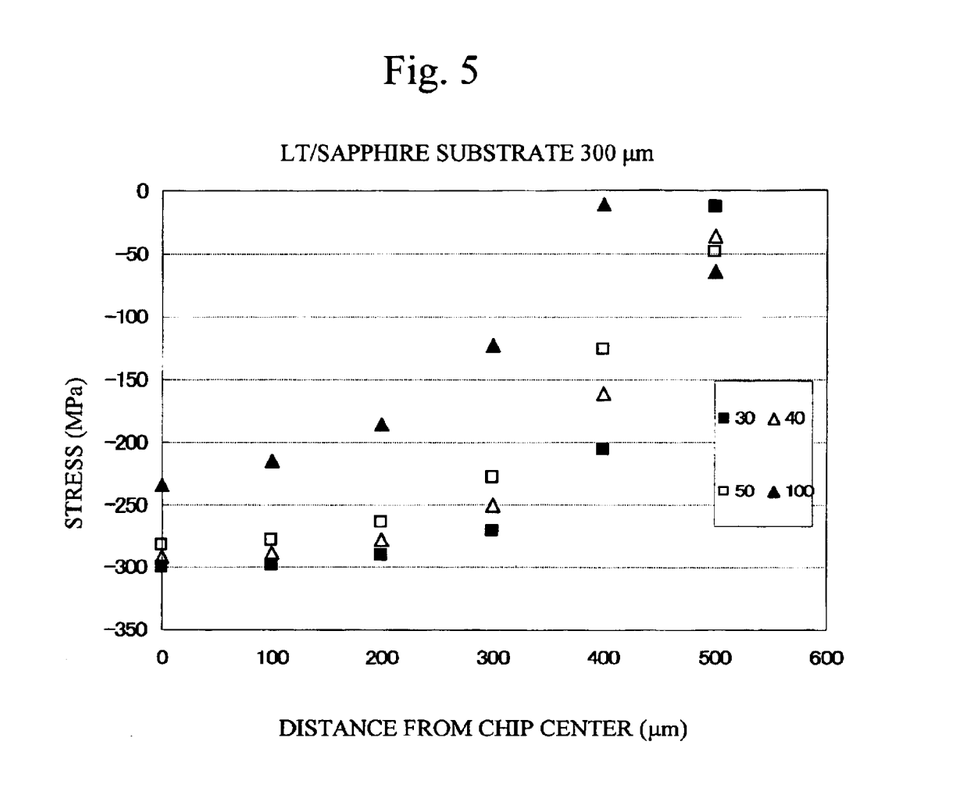
FIG. 5 is a graph of the results of analysis simulation for joint substrates with a support substrate made of sapphire.

In contrast, when the support substrate 20 is made of sapphire, the thermal expansion that occurs at any positions between the chip center and the chip ends has a negative value. This shows that the combination of LT and sapphire for the joint substrate 100 stably restrains the thermal expansion of the piezoelectric substrate 10. This can be seen from a graph of FIG. 5, which shows the on-chip position dependence of thermal stress that occurs in the joint substrate 100 formed by the combination of LT and sapphire. Further, FIG. 5 shows the results of analysis simulation under the condition that the piezoelectric substrate 10 made of LT is 40 μm thick.

It can be seen from the above that the thermal expansion of the piezoelectric substrate 10 can stably be restrained when 1) the piezoelectric substrate 10 is made of LT, 2) the support substrate 20 is made of sapphire, and 3) the thickness (t) of the support substrate 20 is larger than three times the thickness (T) of the piezoelectric substrate 10 (T/t<⅓).

Figure 6:
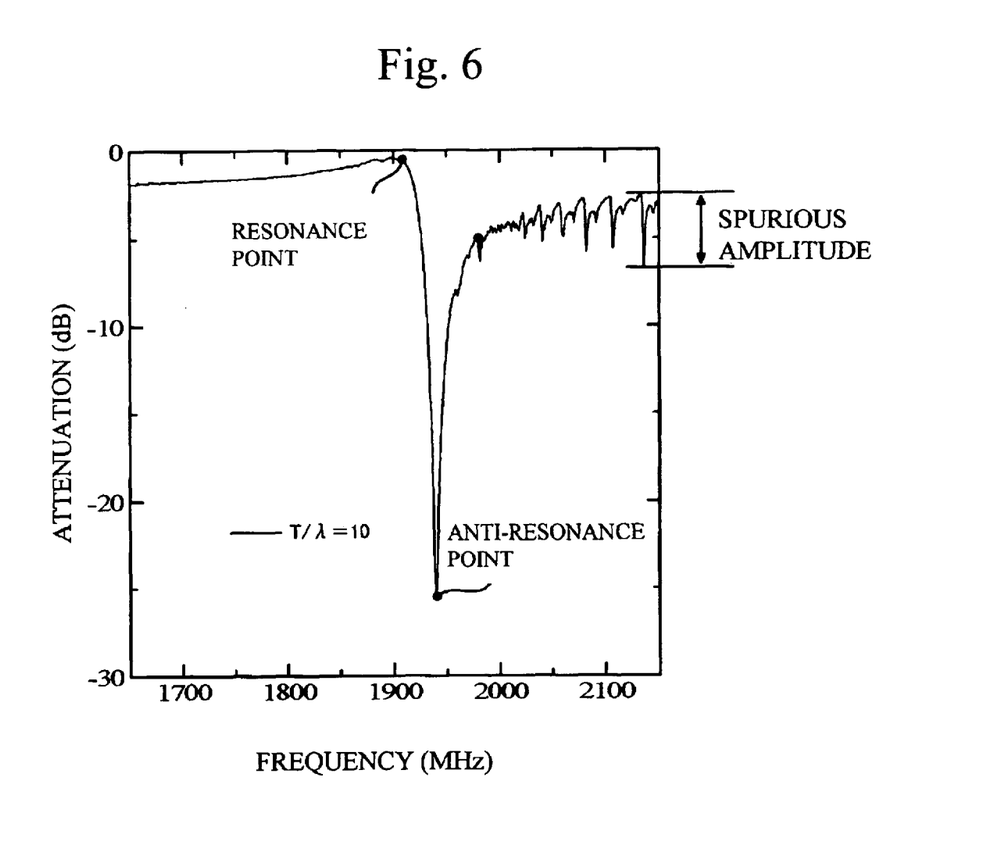
FIG. 6 is a graph of the frequency response of a SAW device having a 1.9 GHz-band SAW resonator on a joint substrate having a 42° Y-cut LT substrate having a thickness of 21 μm and a sapphire support substrate having a thickness of 300 μm.

Next, a description will be given of a spurious component that may be caused when the joint substrate 100 is formed by the combination of different kinds of substrates. FIG. 6 is a frequency response of a SAW device 110 having the following specification. The piezoelectric substrate 10, which is a part of the joint substrate of the SAW device 110, is a 42° Y-cut LT substrate having a cut angle of 42°, and has a thickness (T) of 21 μm. The support substrate 20, which is another part of the joint substrate, is a sapphire substrate having a thickness (t) of 300 μm. The SAW resonator 30 (see FIG. 9) formed on the piezoelectric substrate 10 has a 1.9 GHz band. For the purpose of comparison, FIG. 7 showing the frequency response of a comparative SAW device conventionally used is referred to.

Figure 7:
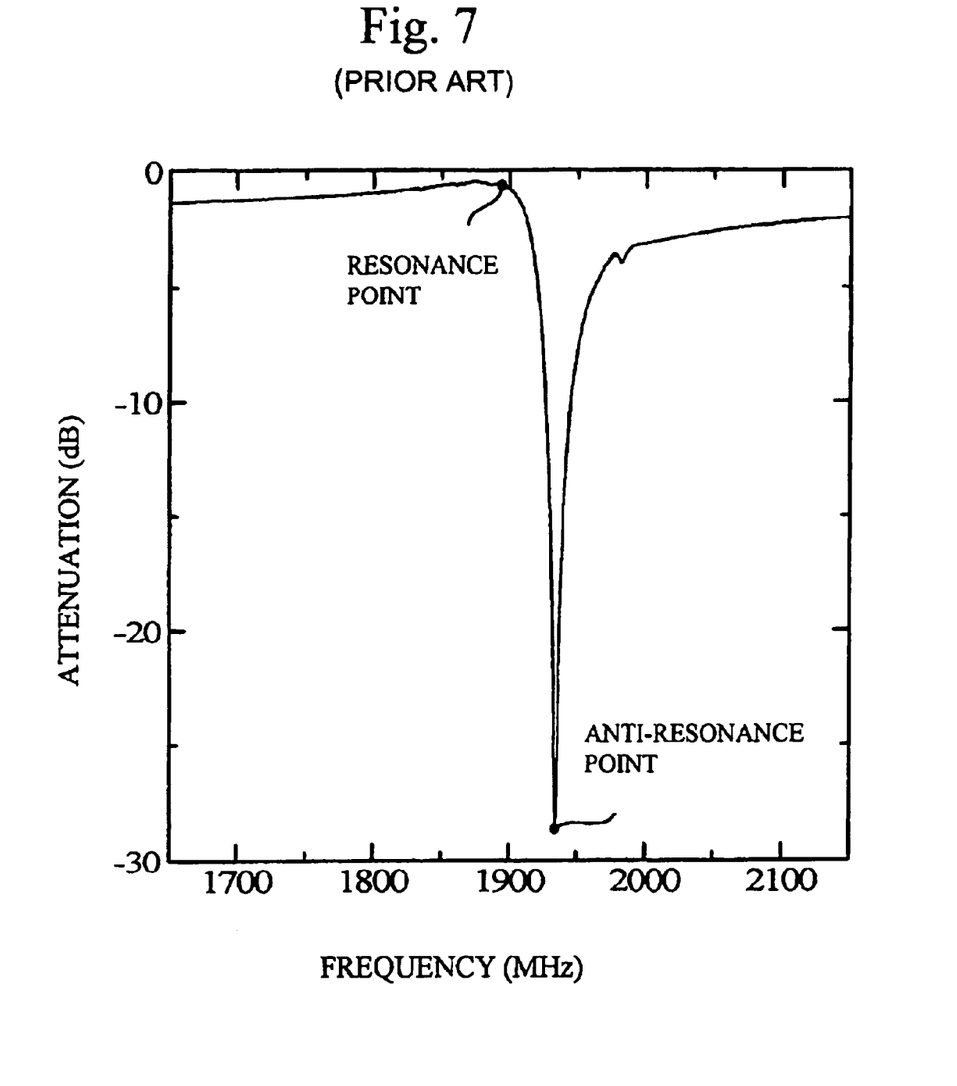
FIG. 7 is a graph of the frequency response of a conventional SAW device.

It can be seen from comparison between FIGS. 6 and 7 that a spurious response occurs on the high-frequency side of the anti-resonance frequency (anti-resonance point) in the frequency response of the SAW device 110 shown in FIG. 6. The spurious response results from a bulk acoustic wave (BAW). More particularly, the bulk acoustic wave is emitted at the same time as the SAW is emitted, and is propagated into the piezoelectric substrate 10. The bulk acoustic wave is reflected at the interface between the piezoelectric substrate 10 and the support substrate 20, which have different acoustic impedance values. The reflected bulk acoustic wave is incident to the comb-like electrodes of the SAW resonator 30. Thus, as the spurious response reduces as the piezoelectric substrate 10 is thicker, and in turn, increases as it is thinner.

Figure 8:
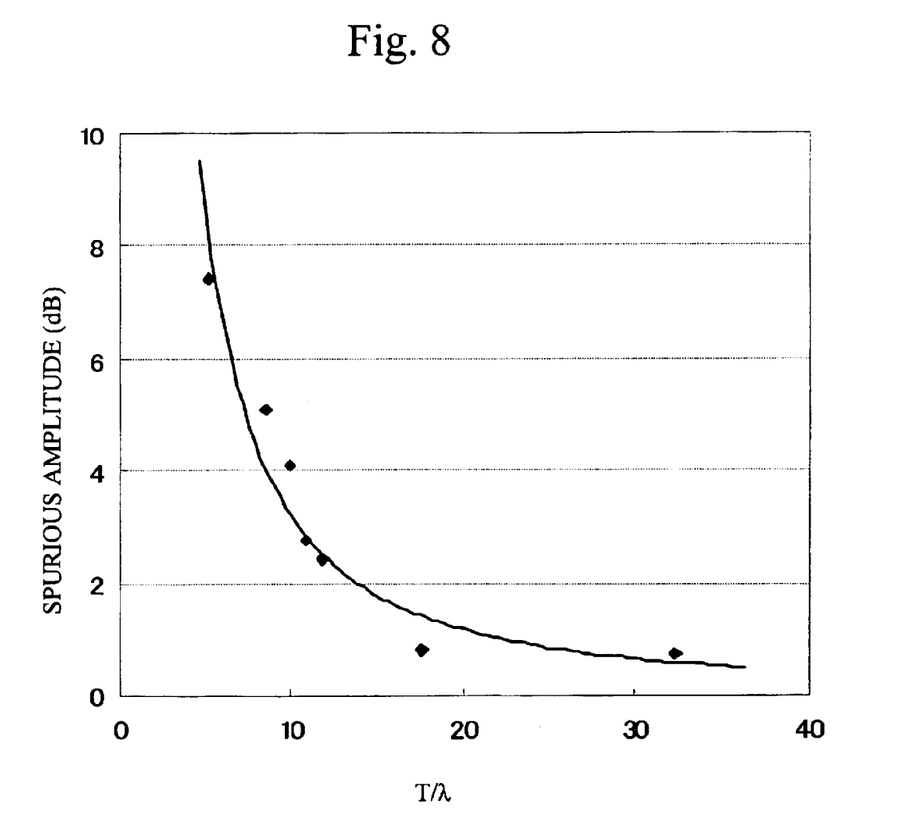
FIG. 8 is a graph showing that the amplitude of a spurious response observed in FIG. 6 depends on the thickness of the piezoelectric substrate.

A description will now be given, with reference to FIG. 8, of a fact such that the amplitude of the spurious response defined in FIG. 6 depends on the thickness of the piezoelectric substrate. FIG. 8 is a graph in which the horizontal axis thereof denotes (the thickness of the piezoelectric substrate)/(the wavelength of SAW), namely, T/λ, and the vertical axis denotes the spurious amplitude. FIG. 8 exhibits that the spurious amplitude increases abruptly when the ratio T/λ becomes smaller than 10. This means that the bulk acoustic wave is greatly reflected at the interface between the piezoelectric substrate 10 and the support substrate 20. The spurious response would not cause a serious problem when the single SAW resonator 30 is used. However, when multiple SAW resonators are used to form a filter such as a duplexer, the spurious response may affect the adjacent pass band. Thus, it is desired to restrain the spurious response. It is thus concluded that the ratio T/λ is preferably set equal to or larger than 10 when multiple SAW resonators 30 are used to form a filter such as a duplexer.

A description will now be given of the SAW device 110 designed taking the spurious response into consideration.

Figure 9:
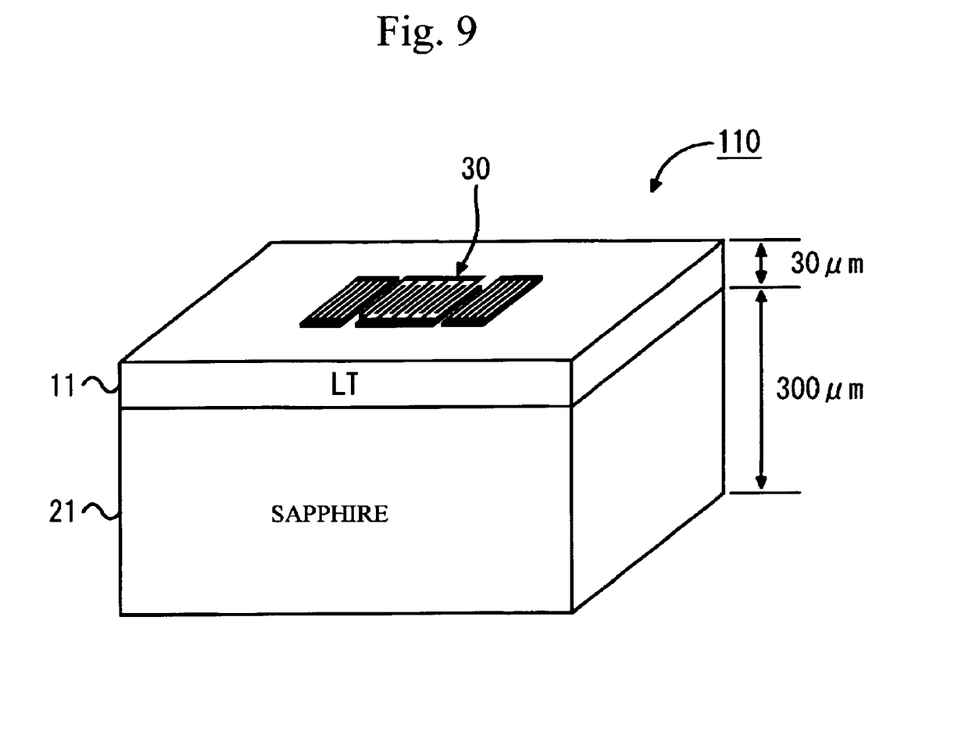
FIG. 9 is a perspective view of a SAW device according to an embodiment of the present invention.

FIG. 9 is a perspective view of the SAW device 110, which employs a 42° Y-cut X-propagation LT substrate 11, which is the main substrate, and an R-plane sapphire substrate 21, which is the support substrate. The LT substrate 11 has a linear expansion coefficient of 16.1 ppm/° C. in the SAW propagation direction (X direction). The sapphire substrate 21 has a linear expansion coefficient of 5.3 ppm/° C. in the SAW propagation direction (X direction). The SAW resonator 30 is provided on the first surface of the LT substrate 11. The SAW resonator 30 has an interdigital transducer having comb-like electrodes that is interposed between two reflection electrodes.

The elastic stiffness ($C_{11}$) of LT is 233 GPa, and the elastic stiffness ($C_{11}$) of sapphire is 497 GPa. Thus, the ratio E/e is as very small as approximately 0.47. The SAW resonator 30 formed on the LT substrate 11 functions as a 1.9 GHz bandpass filter. The SAW has a wavelength of approximately 2.1 μm. The LT substrate 11 is 30 μm thick, and the sapphire substrate 21 is 300 μm thick. In this case, the ratio T/λ is 14 and the thickness of the piezoelectric substrate 11 is as large as 14 times the SAW wavelength λ.

Figure 10:
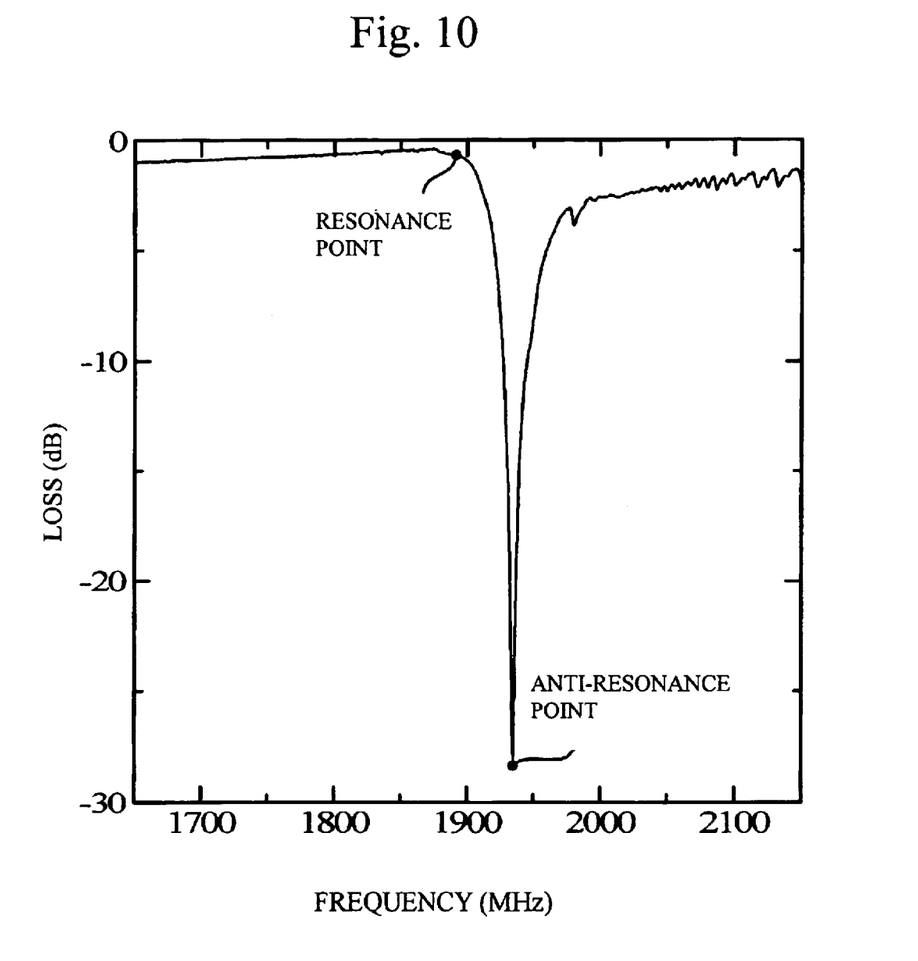
FIG. 10 is a graph of the frequency response of the SAW device shown in FIG. 9.

FIG. 10 shows a frequency response of the SAW device 110 shown in FIG. 9. A spurious response due to the reflection of the bulk acoustic wave caused by the interface is observed on the high-frequency side of the resonance point. However, it should be appreciated that the spurious response is not close to the resonance points and the anti-resonance point and the amplitude of the spurious response is sufficiently small. It can thus be said that the SAW device 110 shown in FIG. 9 has a good frequency response.

In the SAW device 110 shown in FIG. 9, the temperature coefficient of frequency (TCF) at the anti-resonance point is as small as −20 ppm/° C., and that at the resonance points is as small as −10 ppm/° C. In contrast, in the conventional SAW device, the temperature coefficient of frequency at the anti-resonance frequency is −40 ppm/° C., and that at the resonance points is −30 ppm/° C. It can be seen from the above that the SAW device 110 has improved temperature coefficient of frequency.

According to the present embodiment of the invention, the temperature coefficient of frequency can be improved by using the joint substrate having the LT substrate and sapphire substrate and satisfying expression (1):

$$T/t < \tfrac{1}{3} \tag{1}$$

According to the present invention, thermal expansion and contraction of the piezoelectric substrate can be reliably controlled within the chip.

In addition to the above, the spurious response that affects the adjacent pass band can be restrained by satisfying expression (2):

$$T/\lambda > 10 \tag{2}$$

The SAW device 110 with the support substrate 21 made of sapphire is useful to enhance the power durability, particularly, for the duplexer having the function of separating the transmit and receive signals from each other in the cellular phone. Since sapphire having the thermal conductivity (about 40 W/mK) more than ten times that of LT (about 3 W/mK) is used to form the support substrate 21, thermal energy generated at the comb-like electrodes of the SAW resonator 30 is likely to escape through the support substrate 21. This realizes enhanced power durability, as compared to the device with the LT substrate alone. The inventors have confirmed that the 1.9 GHz SAW duplexer having the joint substrate of LT/sapphire has higher power durability than the conventional duplexer with the LT substrate alone.

Figure 11:
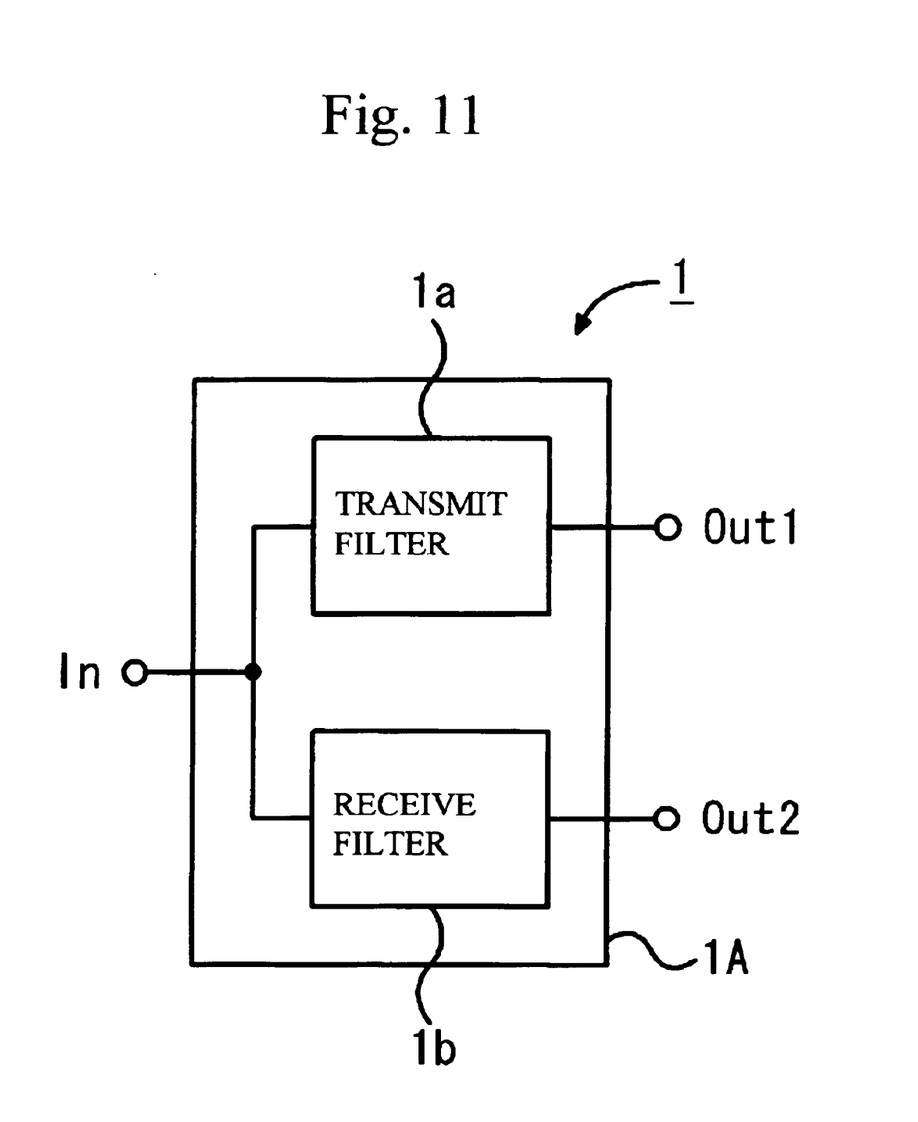
FIG. 11 is a block diagram of a duplexer according to another embodiment of the present invention.

The present invention is not limited to the structure of the above-mentioned embodiment of the invention. The present invention is not limited to the SAW device with only one SAW resonator, but includes multiple SAW resonators, which may be connected so as to form a ladder-type filter, a dual-mode filter, and a duplexer using these filters. Expansion and contraction of the piezoelectric substrate due to thermal stress is restrained more effectively at positions further away from the chip ends. This enables multiple SAW resonators to be arranged on the single chip to achieve a desired filter characteristic. For example, a transmit filter and a receive filter may be arranged on the single chip. FIG. 11 shows a duplexer 1 having a transmit filter 1a and a receive filter 1b, these filters being formed on a single chip 1A.

As described above, the support substrate is made of sapphire that has the Young's modulus equal to or larger than ½ of that of the piezoelectric substrate, and the thickness of the piezoelectric substrate is set equal to or less than ⅓ of that of the support substrate. This enables distortion due to temperature change to be transmitted to the piezoelectric substrate. Thus, the velocity of the SAW is changed so that the temperature stability can be achieved. Particularly, when the piezoelectric substrate is made of LT, the temperature stability of the SAW device is further improved.

Warping may occur in a joint substrate in which the piezoelectric substrate is joined to the support substrate having a relatively small Young's modulus during the process of fabricating the SAW device. For example, warping may occur in baking of resist in the photolithography process or in the dry etching process. In these processes, the joint substrate receives temperature change. Warping is caused by the difference in thermal expansion coefficient between the substrates joined. The occurrence of warping may degrades the production yield or damage the joint substrate. However, the present invention that utilizes the combination of Lt and sapphire is capable of avoiding the above problem. Warping in the LT/sapphire joint substrate can be restrained. The SAW device with the LT/sapphire joint substrate can be produced by the process for the conventional SAW device with a high production yield.

The thickness of the piezoelectric substrate defined according to the present invention improves the frequency response. The piezoelectric substrate and the support substrate respectively have mirror surfaces for obtaining strong joining force. The bulk acoustic wave is reflected at the interface formed by the joined mirror surfaces, and is incident to the comb-like electrodes. This causes the spurious component, which degrades the frequency response. The thinner the piezoelectric substrate, the stronger the reflected bulk acoustic wave incident to the comb-like electrodes. However, the piezoelectric substrate according to the present invention is set relatively thick and has the reduced spurious response. Thus, the SAW device has the good frequency response.

The use of the sapphire support substrate realizes the SAW device having the superior temperature stability without degrading the original electromechanical coupling coefficient of LT.

The present invention does not use the silicon oxide layer and the polarization inverted layer, these layers having difficulty in the production process. The present invention does not utilize the solid-phase reaction by the thermal process. Thus, the present invention does not have frequency deviations and great propagation loss. The present invention does not have difficulty in the production process. The present invention does not facilitate thermal expansion of the piezoelectric substrate but stably controls the thermal expansion within the chip by using the joint substrate of LT and sapphire and designing the SAW device so as to satisfy expressions (1) and (2). When the SAW device satisfies expression (2), the spurious response can be restrained.

The present invention is not limited to the specifically disclosed embodiments, and variations and modifications may be made without departing from the scope of the present invention.

The present invention is based on Japanese Patent Application No. 2002-349749 filed on Dec. 2, 2002, the entire disclosure of which is hereby incorporated by reference.

What is claimed is:

1. A surface acoustic wave device comprising:

a piezoelectric substrate having a first surface on which comb-like electrodes are formed, and a second surface; and a support substrate joined to the second surface of the piezoelectric substrate, the piezoelectric substrate being made of lithium tantalate, and the support substrate being made of sapphire, the following expressions being satisfied:

$$T/t < 1/3 \quad (1)$$

$$T/\lambda > 10 \quad (2)$$

where T is a thickness of the piezoelectric substrate, t is a thickness of the support substrate, and λ is a wavelength of an IDT forming a resonator including the comb-like electrodes, wherein a wave with the wavelength λ is propagated along the first surface of the piezoelectric substrate.

2. The surface acoustic wave device as claimed in claim 1, wherein the piezoelectric substrate is a Y-cut X-propagation piezoelectric substrate.

3. The surface acoustic wave device as claimed in claim 1, wherein the surface acoustic wave device is a filter.

4. A filter comprising:

a piezoelectric substrate having a first surface on which comb-like electrodes are arranged so as to form a transmit filter and a receive filter, and a second surface; and a support substrate joined to the second surface of the piezoelectric substrate, the piezoelectric substrate being made of lithium tantalate, and the support substrate being made of sapphire, the following expressions being satisfied:

$$T/t < 1/3 \quad (1)$$

$$T/\lambda > 10 \quad (2)$$

where T is a thickness of the piezoelectric substrate, t is a thickness of the support substrate, and λ is a wavelength of an IDT forming a resonator including the comb-like electrodes, wherein a wave with the wavelength λ is propagated along the first surface of the piezoelectric substrate.

* * * * *

UNITED STATES PATENT AND TRADEMARK OFFICE
CERTIFICATE OF CORRECTION

PATENT NO. : 6,933,810 B2
DATED : August 23, 2005
INVENTOR(S) : Miura et al.

It is certified that error appears in the above-identified patent and that said Letters Patent is hereby corrected as shown below:

Title page,
Item [73], Assignee, add the following:
-- Fujitsu Media Devices Limited, Yokohama (JP) --.
Item [57], ABSTRACT, amend as follows:
-- A surface acoustic wave device includes a piezoelectric substrate having a first surface on which comb-like electrodes are formed, and a second surface, and a support substrate joined to the second surface of the piezoelectric substrate. The piezoelectric substrate is made of lithium, tantalate, and the support substrate is made of sapphire. The following expressions being satisfied:

$T/t < 1/3$ $T/\lambda > 10$ where T is a thickness of the piezoelectric substrate, t is a thickness of the support substrate, and $\lambda$ is a wavelength of an IDT forming a resonator including the comb-like electrodes propagated along the first surface of the piezoelectric substrate.

Column 2,
Lines 50-53, should read:
-- where T is a thickness of the piezoelectric substrate, t is a thickness of the support substrate, and $\lambda$ is a wavelength of an IDT forming a resonator including the comb-like electrodes propagated along the first surface of the piezoelectric substrate. --.

UNITED STATES PATENT AND TRADEMARK OFFICE
CERTIFICATE OF CORRECTION

PATENT NO. : 6,933,810 B2
DATED : August 23, 2005
INVENTOR(S) : Miura et al.

It is certified that error appears in the above-identified patent and that said Letters Patent is hereby corrected as shown below:

<u>Column 2, line 66 to Column 3, line 2,</u>
Should read:
-- where T is a thickness of the piezoelectric substrate, t is a thickness of the support substrate, and λ is a wavelength of an IDT forming a resonator including the comb-like electrodes propagated along the first surface of the piezoelectric substrate. --.

Signed and Sealed this

Fourteenth Day of March, 2006

JON W. DUDAS
*Director of the United States Patent and Trademark Office*